(12) United States Patent
Yoshida (10) Patent No.: US 7,958,898 B2
(45) Date of Patent: Jun. 14, 2011

(54) SUBSTRATE PROCESSING APPARATUS

(75) Inventor: Takeshi Yoshida, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 81 days.

(21) Appl. No.: 11/864,081

(22) Filed: Sep. 28, 2007

(65) Prior Publication Data
US 2008/0078428 A1    Apr. 3, 2008

(30) Foreign Application Priority Data
Oct. 3, 2006  (JP) .................................. 2006-272147

(51) Int. Cl.
*B08B 3/08*    (2006.01)

(52) U.S. Cl. .................. 134/104.2; 134/902; 156/345.1; 156/345.18

(58) Field of Classification Search ............... 134/104.2, 134/902; 156/345.1, 345.11, 345.18
See application file for complete search history.

(56) References Cited

U.S. PATENT DOCUMENTS

| | | | |
|---|---|---|---|
| 6,793,769 B2 * | 9/2004 | Kajino et al. | 156/345.55 |
| 6,810,888 B2 * | 11/2004 | Tsuchiya et al. | 134/104.2 |
| 2004/0050491 A1 | 3/2004 | Miya et al. | |
| 2005/0244579 A1 | 11/2005 | Matsuzawa et al. | |
| 2006/0222315 A1 | 10/2006 | Yoshida | |
| 2007/0272357 A1 | 11/2007 | Endo et al. | |

FOREIGN PATENT DOCUMENTS

| | | | |
|---|---|---|---|
| EP | 1727191 A1 * | 11/2006 | |
| JP | 2001-35828 | 2/2001 | |
| JP | 2004080054 A * | 3/2004 | |
| JP | 2004-111487 | 4/2004 | |
| JP | 2004265910 A * | 9/2004 | |
| JP | 2005-079219 | 3/2005 | |
| WO | 2005/088691 | 9/2005 | |

OTHER PUBLICATIONS

Machine Translation of JP 2004265910 to Harano, Sep. 2004.*
Machine Translation of JP 2004080054 to Kamiyama, Mar. 2004.*
Office Action issued Dec. 19, 2008 in connection with the corresponding Korean Patent Application No. 10-2007-0097290.
Office Action issued in connection with corresponding U.S. Appl. No. 11/396,700.
Korean Notice of Allowance issued on Aug. 28, 2009 in corresponding Korean Patent Application No. 10-2007-0097290 (Korean language).

* cited by examiner

*Primary Examiner* — Joseph L Perrin
*Assistant Examiner* — Benjamin Osterhout
(74) *Attorney, Agent, or Firm* — Ostrolenk Faber LLP (57) ABSTRACT

An substrate processing apparatus includes a substrate holding unit, a process liquid supplying unit, a first guide portion provided around the substrate holding unit for guiding the process liquid scattered from the substrate, a second guide portion provided outside the first guide portion for guiding the process liquid scattered from the substrate, a third guide portion provided outside the second guide portion for guiding the process liquid scattered from the substrate, a first recovery channel provided outside the first guide portion integrally with the first guide portion for recovering the process liquid guided by the second guide portion, a second recovery channel provided outside the first recovery channel integrally with the first guide portion for recovering the process liquid guided by the third guide portion, and a driving mechanism for independently moving up and down the first, second, and third guide portions.

4 Claims, 5 Drawing Sheets

SUBSTRATE PROCESSING APPARATUS

BACKGROUND OF THE INVENTION

1. Field of the Invention

The present invention relates to a substrate processing apparatus. Examples of the substrate to be processed include semiconductor wafers, substrates for liquid crystal display devices, substrates for plasma display devices, substrates for field emission displays (FED), substrates for optical disks, substrates for magnetic disks, substrates for magneto-optical disks, and substrates for photo masks.

2. Description of Related Art

In production processes for semiconductor devices and liquid crystal display devices, a single substrate processing apparatus is used for processing a surface of a substrate a semiconductor wafer, a glass substrate for a liquid crystal display panel or the like with a process liquid. For reduction of the consumption of the process liquid, some of the substrate processing apparatuses of this type are adapted to recover the process liquid used for the process of the substrate and reuse the recovered process liquid for the subsequent process.

Such a substrate processing apparatus adapted to reuse the process liquid includes, for example, a spin chuck which horizontally holds and rotates a substrate, a bottomed hollow cylindrical cup in which the spin chuck is accommodated, and a splash guard provided vertically movably with respect to the cup. See US Patent Application Publication No. 2004/0050491 A1, for example.

The cup has an annular drain channel provided around the spin chuck. The cup further has three annular recovery channels triply concentrically provided around the drain channel. The drain channel is connected to a waste liquid drain for draining the process liquid. The recovery channels are each connected to a recovery drain for guiding the process liquid to a recovery tank.

The splash guard includes four guards vertically and radially overlapped with each other. The guards each have a substantially rotationally symmetrical shape about the rotation axis of the substrate. Upper edge portions of the guards are each inclined upward toward the rotation axis of the substrate. Upper edges of the guards are located in predetermined spaced relation on a cylindrical plane having a center axis aligning with the rotation axis of the substrate. The guards are respectively associated with the recovery channels and the drain channel, and lower edges of the guards are respectively inserted in the recovery channels and the drain channel. That is, the uppermost guard (first guard) is associated with the outermost recovery channel (first channel), and the lower edge of the first guard is inserted in the first recovery channel. A guard (second guard) immediately below the first guard is associated with a recovery channel (second channel) disposed inwardly adjacent to the first recovery channel, and the lower edge of the second guard is inserted in the second recovery channel. A guard (third guard) immediately below the second guard is associated with the innermost recovery channel (third recovery channel inwardly adjacent to the second recovery channel), and the lower edge of the third guard is inserted in the third recovery channel. The lowermost guard (fourth guard) is associated with the drain channel, and the lower edge of the fourth guard is inserted in the drain channel.

A first recovery port is defined between the upper edge of the first guard and the upper edge of the second guard for introducing the process liquid scattered from the substrate into the first recovery channel. A second recovery port is defined between the upper edge of the second guard and the upper edge of the third guard for introducing the process liquid scattered from the substrate into the second recovery channel. A third recovery port is defined between the upper edge of the third guard and the upper edge of the fourth guard for introducing the process liquid scattered from the substrate into the third recovery channel. A drain port is defined between the fourth guard and a bottom surface of the cup for introducing the process liquid scattered from the substrate into the drain channel.

A lift driving mechanism, for example, including a ball screw mechanism and the like is connected to the splash guard. The four guards are moved up and down together by the lift driving mechanism.

In the substrate processing apparatus having the aforesaid construction, plural types of process liquids are sequentially supplied to the surface of the substrate to treat the substrate surface sequentially with the plural types of process liquids. Further, the plural types of process liquids used for the processes are separately recovered.

More specifically, the substrate surface is processed with a first process liquid by supplying the first process liquid to the substrate surface while rotating the substrate by the spin chuck. The first process liquid supplied to the substrate surface is scattered radially outward from the peripheral edge of the substrate by a centrifugal force generated by the rotation of the substrate. At this time, the splash guard is vertically moved to bring the first recovery port into opposed relation to a peripheral edge surface of the substrate, whereby the first process liquid scattered from the peripheral edge of the substrate is introduced into the first recovery port. Then, the first process liquid is recovered into the recovery tank through the recovery drain. Similarly, when a second process liquid is supplied to the substrate surface, the second recovery port is opposed to the peripheral edge surface of the substrate to recover the second process liquid scattered from the substrate. When a third process liquid is supplied to the substrate surface, the third recovery port is opposed to the peripheral edge surface of the substrate to recover the third process liquid scattered from the substrate.

Further, a rinsing operation is performed to rinse the substrate surface with pure water (process liquid) by supplying the pure water to the substrate surface while rotating the substrate by the spin chuck. At this time, the drain port is opposed to the peripheral edge surface of the substrate, whereby the pure water used for the rinsing of the substrate surface is collected in the drain channel and drained from the drain channel through the waste liquid drain.

However, the substrate processing apparatus having the aforesaid construction has several problems described below.

1. The recovery ports are constantly open. Therefore, even with a predetermined one of the recovery ports and the drain port being opposed to the peripheral edge surface of the substrate, the process liquid scattered from the substrate is liable to enter the other ports (particularly the ports adjacent to the predetermined one port), thereby contaminating the process liquids recovered through the other ports in the corresponding recovery channels. During the process with the first process liquid, for example, the scattered first process liquid is liable to partly enter the second recovery port even with the first recovery port being opposed to the peripheral edge surface of the substrate, thereby contaminating the second process liquid recovered in the second recovery channel.

2. When the lowermost drain port is brought into opposed relation to the peripheral edge surface of the substrate, the splash guard should be moved up a greater distance. Therefore, a greater space should be provided above the cup, so that the apparatus has a greater height.

3. Where types of process liquids to be recovered are increased, the existing splash guard should be replaced with a splash guard having a correspondingly increased number of guards. This inevitably results in a significant cost increase. In addition, the height of the splash guard is increased, thereby the vertical movement distance of the splash guard is further increased. This increases the height of the apparatus.

SUMMARY OF THE INVENTION

It is a first object of the present invention to provide a substrate processing apparatus which prevents a process liquid recovered in a recovery channel from being contaminated with other process liquids (process liquids which should not be recovered in that recovery channel).

It is a second object of the present invention to provide a substrate processing apparatus which has a reduced height.

It is a third object of the present invention to provide a substrate processing apparatus which can be modified so as to recover an increased types of process liquids without a significant cost increase.

The substrate processing apparatus of the present invention comprises a substrate holding unit which generally horizontally holds a substrate and rotates the substrate about a generally vertical rotation axis, a process liquid supplying unit for supplying a process liquid to the substrate held by the substrate holding unit, a first guide portion provided around the substrate holding unit and having an upper edge portion extending toward the rotation axis for guiding the process liquid scattered from the substrate rotated by the substrate holding unit to cause the process liquid to flow down, a second guide portion provided around the substrate holding unit outside the first guide portion and having an upper edge portion extending toward the rotation axis as vertically overlapping with the upper edge portion of the first guide portion for guiding the process liquid scattered from the substrate rotated by the substrate holding unit to cause the process liquid to flow down, a third guide portion provided around the substrate holding unit outside the second guide portion and having an upper edge portion extending toward the rotation axis as vertically overlapping with the upper edge portion of the second guide portion for guiding the process liquid scattered from the substrate rotated by the substrate holding unit to cause the process liquid to flow down, a first recovery channel provided outside the first guide portion integrally with the first guide portion for recovering the process liquid guided by the second guide portion, a second recovery channel provided outside the first recovery channel integrally with the first guide portion for recovering the process liquid guided by the third guide portion, and a driving mechanism for moving up and down the first guide portion, the second guide portion, and third guide portion independently of each other.

With this arrangement, the first guide portion, the second guide portion, and the third guide portion triply surround the substrate holding mechanism, while the second guide portion is disposed outside the first guide portion with the upper edge portion thereof vertically overlapping with the upper edge portion of the first guide portion. Further, the third guide portion is disposed outside the second guide portion with the upper edge portion thereof vertically overlapping with the upper edge portion of the second guide portion. Furthermore, the first recovery channel for recovering the process liquid guided by the second guide portion and the second recovery channel for recovering the process liquid guided by the third guide portion are provided outside the first guide portion integrally with the first guide portion.

The first guide portion, the second guide portion, and the third guide portions can be moved up and down independently of each other by the driving mechanism. Accordingly, each upper edge portion of the first to third guide portions is located at a lower level than the substrate to provide a state in which the process liquid from the substrate is not received by any of the first to third guide portions. Alternatively, each upper edge portion of the first to third guide portions is located at an upper level than the substrate to provide a state in which the process liquid is received by the first guide portion. Further alternatively, the upper edge portion of the first guide portion is located at a lower level than the substrate, and each upper edge portion of the second and third guide portions is located at an upper level than the substrate to provide a state in which the process liquid is received by the second guide portion (first recovery state). Still further, each upper edge portion of the first and second guide portions is located at a lower level than the substrate, and the upper edge portion of the third guide portion is located at an upper level than the substrate to provide a state in which the process liquid is received by the third guide portion (second recovery state).

In the first recovery state, an opening is defined between the upper edge portion of the first guide portion and the upper edge portion of the second guide portion in opposed relation to a peripheral edge surface of the substrate. Therefore, the process liquid scattered from the substrate is introduced into the opening between the upper edge portion of the first guide portion and the upper edge portion of the second guide portion, and the introduced process liquid is guided by the second guide portion to be recovered in the first recovery channel. By moving up the first guide portion from this state with the second and third guide portions kept still so as to locate each upper edge portion of the first to third guide portions at a higher level than the substrate, the first guide portion is brought into opposed relation to the peripheral edge surface of the substrate. Thus, the process liquid scattered from the substrate can be guided by the first guide portion to flow down.

In the second recovery state, an opening is defined between the upper edge portion of the second guide portion and the upper edge portion of the third guide portion in opposed relation to a peripheral edge surface of the substrate. Therefore, the process liquid scattered from the substrate is introduced into the opening between the upper edge portion of the second guide portion and the upper edge portion of the third guide portion, and the introduced process liquid is guided by the third guide portion to be recovered in the second recovery channel. By moving up the first and second guide portions from this state (preferably in synchronization) with the third guide portion kept still so as to locate each upper edge portion of the first to third guide portions at a higher level than the substrate, the first guide portion is brought into opposed relation to the peripheral edge surface of the substrate. Thus, the process liquid scattered from the substrate can be guided by the first guide portion to flow down.

Switching between the first recovery state and the second recovery state can be performed by moving up and down the second guide portion with the first guide portion and third guide portion kept still.

When the process liquid is to be guided by the first guide portion, the first guide portion is moved up to the vicinity of the second guide portion with a very small gap being defined between the upper edge portion thereof and the upper edge portion of the second guide portion, and the second guide portion and the third guide portion are brought to the vicinity of each other with a very small gap being defined between the respective upper edge portions thereof. Thus, the process liquid scattered from the substrate is guided by the first guide portion to flow down, while being prevented from intruding into the gap between the upper edge portion of the first guide portion and the upper edge portion of the second guide portion, and the gap between the upper edge portion of the second guide portion and the upper edge portion of the third guide portion. Similarly, when the process liquid is to be guided by the second guide portion, a small gap is defined between the upper edge portion of the second guide portion and the upper edge portion of the third guide portion by bringing them to the vicinity of each other. Thus, the process liquid scattered from the substrate is guided by the second guide portion for recovery thereof, while being prevented from intruding into the gap between the upper edge portion of the second guide portion and the upper edge portion of the third guide portion. Further, when the process liquid is to be guided by the third guide portion, a small gap is defined between the upper edge portion of the first guide portion and the upper edge portion of the second guide portion by bringing them to the vicinity of each other. Thus, the process liquid scattered from the substrate is guided by the third guide portion for recovery thereof, while being prevented from intruding into the gap between the upper edge portion of the first guide portion and the upper edge portion of the second guide portion. Still further, when the process liquid is not received by any of the guide portions, the upper edge portions of the first to third guide portions are located at a lower level than the substrate, and the upper edge portions of the second and third guide portions are brought to the vicinity of each other with a very small gap being defined therebetween. Thus, the undesired process liquid can be suppressed or prevented from intruding into the first recovery channel or the second recovery channel. As a result, the purity of the process liquid recovered in each of the recovery channels can further be improved. In addition, when such implementation is performed as described above, the contact between the first guide portion, the second guide portion, and the third guide portion can be avoided, so that a problem associated with particles which may otherwise be generated by the contact can be eliminated.

When the process liquid is to be guided by the first guide portion, there is no particular need to move up the second guide portion and the third guide portion, but the second guide portion and the third guide portion may be located at the same position as assumed for guiding the process liquid by the second guide portion and the third guide portion. Similarly, when the process liquid is to be guided by the second guide portion, there is no particular need to move up the third guide portion, but the third guide portion may be located at the same position as assumed for guiding the process liquid by the third guide portion. Hence, there is no need to provide a greater space above the recovery channel; thereby the height of the apparatus is correspondingly reduced.

Where the types of process liquids to be recovered is increased, a guide portion is additionally provided around the third guide portion outside the third guide portion, and a recovery channel for recovering a process liquid to be guided by the additional guide portion is additionally provided integrally with the first guide portion to locate outside the second recovery channel. Therefore, the existing second guide portion and the third guide portion can be used, so that a significant cost increase can be avoided. That is, the apparatus can be thus modified so as to recover an increased types of process liquids without a significant cost increase. Further, when the process liquid is to be guided by the guide portion inside of the additional guide portion, there is no particular need to move up the additional guide portion, thereby the increase in the height of the apparatus is avoided.

A substrate processing apparatus may further includes a process liquid separating wall provided integrally with the second guide portion for preventing the process liquid guided into a-space between the upper edge portion of the second guide portion and the upper edge portion of the third guide portion from intruding into the first recovery channel to guide the process liquid to the second recovery channel. With this arrangement, when the upper edge portion of the first guide portion and the upper guide portion of the second guide portion are brought to the vicinity of each other and an opening is formed between the second guide portion and the third guide portion so as to receive the process liquid from the substrate in the third guide portion to guide the process liquid to the second recovery channel, the process liquid can be suppressed or prevented from intruding into the first recovery channel.

The substrate processing apparatus of the present invention preferably comprises a first intrusion preventing portion and a second intrusion preventing portion for preventing the process liquid scattered from the substrate rotated by the substrate holding unit from intruding into a space between the first guide portion and the second guide portion, and into a space between the second guide portion and the third guide portion, respectively when the process liquid is guided by the first guide portion.

With this arrangement, the provision of the first intrusion preventing portion and the second intrusion preventing portion makes it possible to guide the process liquid scattered from the substrate by the first guide portion to cause the process liquid to flow down while assuredly preventing the process liquid from intruding into the space between the first guide portion and the second guide portion, or the space between the second guide portion and the third guide portion. Therefore, a process liquid different from the process liquid to be recovered in the recovery channel is assuredly prevented from entering the recovery channel. As a result, the purity of the process liquid recovered in the recovery channel can be further improved. Further, when an opening is formed in the space between the upper end portion of the first guide portion and the upper end portion of the second guide portion to receive the process liquid from the substrate with the second guide portion, the second intrusion preventing portion blocks the space between the upper end portion of the second guide portion and the upper end portion of the third guide portion to prevent the process liquid from entering the second recovery channel. Further, when an opening is formed in the space between the upper end portion of the second guide portion and the upper end portion of the third guide portion to receive the process liquid from the substrate with the third guide portion, the first intrusion preventing portion blocks the space between the upper end portion of the first guide portion and the upper end portion of the second guide portion to prevent the process liquid from entering the first recovery potion.

The first intrusion preventing portion is preferably a part of the upper edge portion of the second guide portion folded downward, and the second intrusion preventing portion is a part of the upper edge portion of the third guide portion folded downward.

With this arrangement, the first intrusion preventing portion extends downward from the upper edge of the second guide portion, so that the process liquid scattered from the substrate is prevented from flowing around the first intrusion preventing portion and intruding into the space between the first guide portion and the second guide portion. Similarly, the second intrusion preventing portion extends downward from the upper edge of the third guide portion, so that the process liquid scattered from the substrate is prevented from flowing around the second intrusion preventing portion and intruding into the space between the second guide portion and the third guide portion. Therefore, when the process liquid guided by the second guide portion or the third guide portion is recovered, the recovered process liquid is assuredly prevented from being contaminated with other process liquids. As a result, the purity of the recovered process liquid can further be improved. In addition, the first intrusion preventing portion and the second intrusion preventing portion are formed unitary with the second guide portion and the third guide portion, respectively, so that the construction of the apparatus is simplified.

The foregoing and other objects, features and effects of the present invention will become more apparent from the following detailed description of preferred embodiments with reference to the attached drawings.

DETAILED DESCRIPTION OF PREFERRED EMBODIMENTS

Figure 1:
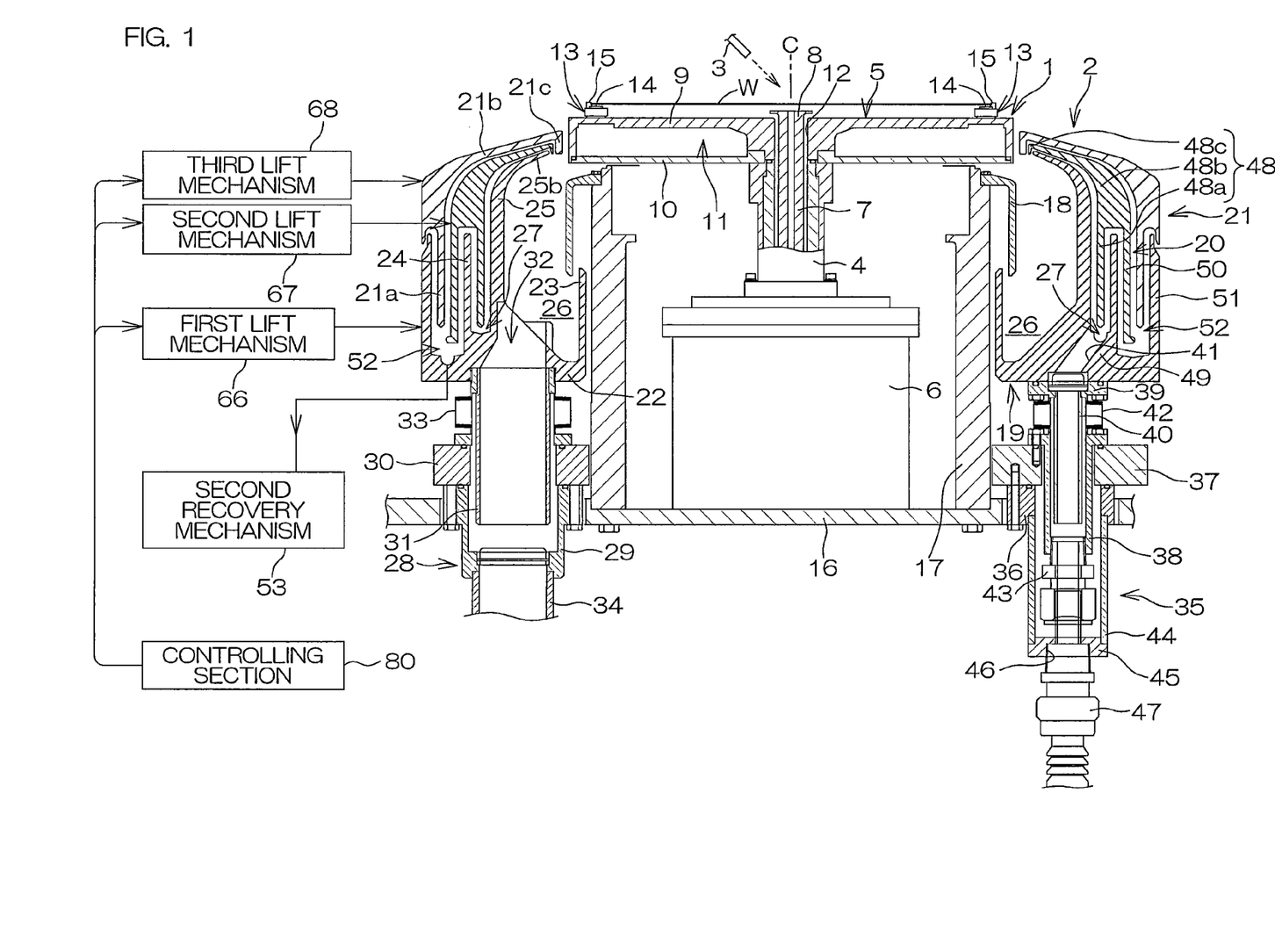
FIG. 1 is a sectional view illustrating a construction of a substrate processing apparatus according to an embodiment of the present invention.

FIG. 1 is a sectional view illustrating a construction of a substrate processing apparatus according to an embodiment of the present invention.

The substrate processing apparatus is adapted to perform a cleaning process on a wafer W (an example of a substrate) by supplying a first chemical, a second chemical and pure water (deionized water) as a process liquid in a predetermined order to the wafer W. The substrate processing apparatus includes a spin chuck 1 for generally horizontally holding the wafer W and rotating the wafer W about a generally vertical rotation axis C, a cup 2 in which the spin chuck 1 is accommodated, and a nozzle 3 for selectively supplying the first chemical, the second chemical and the pure water to a surface (upper surface) of the wafer W held by the spin chuck 1. FIG. 1 shows a section taken along different planes on the left side and the right side with respect to the rotation axis C.

The nozzle 3, for example, may be disposed at a fixed position obliquely upward of the spin chuck 1 for supplying the process liquid to a surface of the wafer W from the obliquely upward position. Further, the nozzle 3 may be disposed at a fixed position on the rotation axis of the wafer W rotated by the spin chuck 1 for supplying the process liquid to the surface of the wafer W from the position vertically upward of the wafer W. Alternatively, a so-called scan nozzle system may be employed in which the nozzle 3 is attached to an arm pivotal within a horizontal plane above the spin chuck 1 (cup 2) and a process liquid supply position on the surface of the wafer W is scanned by pivoting the arm. Further, where a shield plate is disposed in closely opposed relation to the surface of the wafer W during a drying operation to be described later, a process liquid supply port may be provided in a center portion of the shield plate, so that the process liquid is supplied to the surface of the wafer W from the process liquid supply port.

The spin chuck 1 includes a rotation shaft 4 disposed generally vertically, a disk-shaped spin base 5 fixed to an upper end of the rotation shaft 4, and a motor 6 disposed below the spin base 5.

The rotation shaft 4 is a hollow shaft integral with a driving shaft of the motor 6. A rear surface process liquid supply pipe 7 extends through the inside of the rotation shaft 4. The first chemical, the second chemical and the pure water are selectively supplied to the rear surface process liquid supply pipe 7. The rear surface process liquid supply pipe 7 has a rear surface nozzle 8 provided at an upper end thereof for spouting the process liquid (the first chemical, the second chemical or the pure water) selectively supplied to the rear surface process liquid supply pipe 7. The rear surface nozzle 8 spouts the process liquid generally vertically upward. The process liquid spouted from the rear surface nozzle 8 is generally vertically incident on a center portion of the rear surface of the wafer W held by the spin chuck 1.

The spin base 5 includes an upper cover 9 having a disk shape as seen in plan, and a lower cover 10 having also a disk shape as seen in plan. The upper cover 9 and the lower cover 10 are fixed to each other by bolts to define an accommodating space 11 therebetween for accommodating a link mechanism to be described later. The spin base 5 has a through-hole 12 provided in a center portion thereof (center portions of the upper cover 9 and the lower cover 10 thereof) as having substantially the same inner diameter as the rotation shaft 4. An upper end of the rotation shaft 4 is connected to the periphery of the through-hole 12, so that an interior surface of the rotation shaft 4 is continuous with a peripheral surface of the through-hole 12 with no step. A portion of the rear surface process liquid supply pipe 7 projects from the upper end of the rotation shaft 4, and the projecting portion of the rear surface process liquid pipe 7 is inserted in the through-hole 12.

A plurality of holder members 13 (three holder members 13 in this embodiment) are disposed generally equiangularly on a peripheral edge of an upper surface of the spin base 5. The holder members 13 each include a support portion 14 for supporting the wafer W from a lower side, and a restricting portion 15 for restricting a peripheral edge surface of the wafer W. The holder members 13 are coupled to each other by the link mechanism (not shown) accommodated in the spin base 5. The holder members 13 cooperatively hold the wafer W with the restricting portions 15 thereof in abutment against the peripheral edge of the wafer W supported by the support portions 14 thereof. The holder members 13 are disengaged from the wafer W with the restricting portions 15 thereof being retracted from the peripheral edge of the wafer W.

The motor 6 is disposed on a horizontally extending base 16, and surrounded by a tubular cover member 17. The cover member 17 has a lower edge fixed to the base 16, and an upper edge portion extending to the vicinity of the lower cover 10 of the spin base 5. A flange 18 is provided on the upper edge portion of the cover member 17 as generally horizontally projecting outward from the cover member 17 and bent downward.

The cup 2 includes an inner structural member 19, a middle structural member 20 and an outer structural member 21 which are vertically movable independently of each other.

The inner structural member 19 surrounds the spin chuck 1, and has a rotationally symmetrical shape about the rotation axis C of the wafer W to be rotated by the spin chuck 1. The inner structural member 19 integrally includes a bottom portion 22 having an annular plan shape, a hollow cylindrical inner wall 23 projecting upward from an inner peripheral edge of the bottom portion 22, a hollow cylindrical outer wall 51 projecting upward from an outer peripheral edge of the bottom portion 22, a first guide portion 25 projecting upward from a portion thereof between the inner wall 23 and the outer wall 51 and having an upper edge portion smoothly arcuately extending obliquely upward toward the center thereof (toward the rotation axis C of the wafer W), and a hollow cylindrical middle wall 24 projecting upward from a portion between the first guide portion 25 and the outer wall 51.

Figure 4:
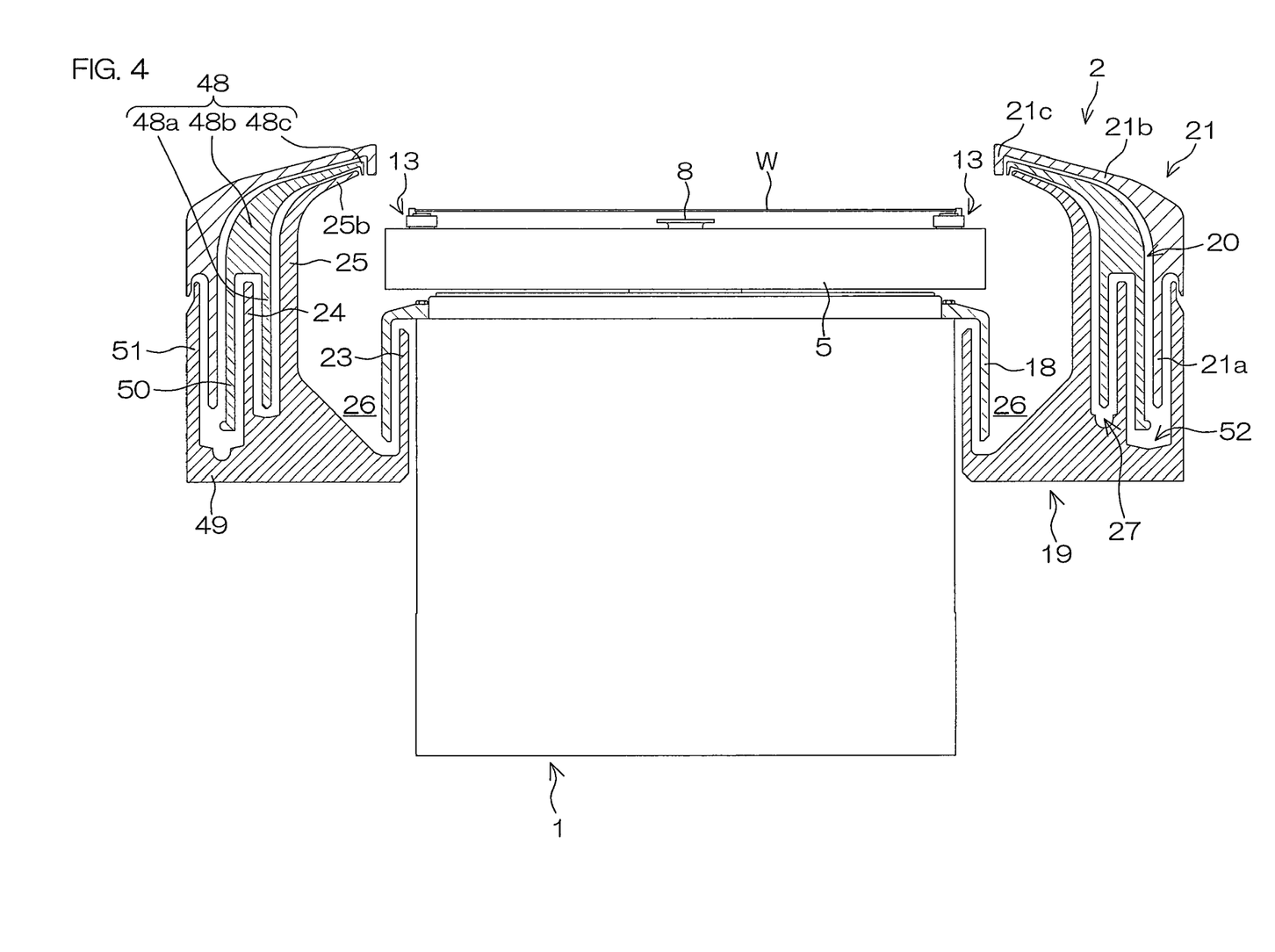
FIG. 4 is a schematic sectional view for explaining positions of the inner structural member, the middle structural member and the outer structural member during a rinsing operation.

The inner wall 23 has a length such as to be accommodated between the cover member 17 and the flange 18 in spaced relation from the cover member 17 and the flange 18 when the inner structural member 19 is located at the uppermost position (as indicated in FIG. 4).

The middle wall 24 has a length such as to be accommodated between a second guide portion 48 (lower edge portion 48a) and a process liquid separating wall 50 of the middle structural member 20 to be described later in spaced relation from the second guide portion 48 and the process liquid separating wall 50 when the inner structural member 19 and the middle structural member 20 are located in the closest relation.

The first guide portion 25 has an upper edge portion 25b smoothly arcuately extending obliquely upward toward the center thereof (toward the rotation axis C of the wafer W). A drain channel 26 is defined between the inner wall 23 and the first guide portion 25 for collecting and draining the process liquid used for the process of the wafer W. An annulus inner recovery channel 27 (first recovery channel) is defined between the first guide portion 25 and the middle wall 24 for collecting and recovering the process liquid used for the process of the wafer W. An annulus outer recovery channel 52 (second recovery channel) is defined between the middle wall 24 and the outer wall 51 for collecting and recovering a process liquid of different kind used for the process of the wafer W. The bottoms of the annulus inner recovery channel 27 and the annulus outer recovery channel 52 are inclined slightly with respect to the horizontal plane, so that the portions where the first recovery channel 35 and the second recovery channel 53 described later are connected at lowest. As a result, the process liquid flown down to the inner recovery channel 27 and the outer recovery channel 52 can be smoothly recovered.

An evacuation mechanism 28 is connected to the drain channel 26 for draining the process liquid collected in the drain channel 26 and forcibly exhausting air from the drain channel 26. The evacuation mechanism 28 includes, for example, four evacuation mechanisms 28 disposed at an interval equiangularly with respect to the drain channel 26.

The evacuation mechanisms 28 each include a stationary tubular member 29 extending through the base 16, an annular spacer 30 fixed to an upper end of the stationary tubular member 29, a movable tubular member 31 having an upper end connected to the bottom portion 22 of the inner structural member 19 and a lower end portion inserted in the spacer 30 and the stationary tubular member 29, a communication port 32 communicating the movable tubular member 31 to the drain channel 26, and a bellows 33 having an upper end fixed to the bottom portion 22 of the inner structural member 19 and a lower end fixed to the spacer 30 and covering an outer periphery of the movable tubular member 31.

A pipe 34 extending from a negative pressure source not shown is connected to a lower end of the stationary tubular member 29. When the stationary tubular member 29 is evacuated through the pipe 34 by a negative pressure generated by the negative pressure source, an atmosphere in the drain channel 26 is sucked into the stationary tubular member 29 through the movable tubular member 31. When the process liquid used for the process of the wafer W is collected in the drain channel 26, the process liquid collected in the drain channel 26 is discharged together with the atmosphere from the drain channel 26 through the communication port 32, the movable tubular member 31, the stationary tubular member 29 and the pipe 34. The process liquid discharged together with the atmosphere is separated from the atmosphere by a gas/liquid separator (not shown) disposed in the midst of the pipe 34, and drained, for example, into a drain line of a plant in which the substrate processing apparatus is installed.

A first recovery mechanism 35 is connected to the lowest bottom portion of the inner recovery channel 27 for recovering the process liquid collected in the inner recovery channel 27 into a first recovery tank not shown.

The recovery mechanisms 35 each include a hollow cylindrical insertion member 36 extending through the base 16, an annular spacer 37 fixed to an upper end of the insertion member 36, a stationary tubular member 38 having an upper end portion fixed to an upper surface of the spacer 37 and extending downward through the insertion member 36 and the spacer 37, a retainer member 39 fixed to the bottom portion 22 of the inner structural member 19, a movable tubular member 40 having an upper end portion retained by the retainer member 39 and a lower end portion inserted in the stationary tubular member 38, a communication port 41 communicating the inside of the movable tubular member 40 to the inner recovery channel 27, a bellows 42 having an upper end fixed to the retainer member 39 and a lower end fixed to the stationary tubular member 38 and covering an outer periphery of the movable tubular member 40, a joint 43 screwed into a lower end portion of the stationary tubular member 38, a tubular joint surrounding member 44 extending downward from a lower end portion of the insertion member 36 and surrounding the joint 43, and a cap member 45 closing a lower end opening of the joint surrounding member 44.

The cap member 45 has a connection port 46. A recovery pipe 47 extending from the first recovery tank is connected to the joint 43 through the connection port 46. The process liquid collected in the inner recovery channel 27 is recovered in the first recovery tank through the communication port 41, the movable tubular member 40, the stationary tubular member 38, the joint 43 and the recovery pipe 47.

A second recovery mechanism 53 is connected to the lowest bottom portion of the outer recovery channel 52 for recovering the process liquid collected in the outer recovery channel 52 into a second recovery tank not shown. Since the construction of the second recovery mechanism 53 is substantially the same as the construction of the first recovery mechanism 35, FIG. 1 merely illustrates the second recovery mechanism 53, schematically, and detailed description thereof is omitted.

The middle structural member 20 surrounds the spin chuck 1, and has a generally rotationally symmetrical shape about the rotation axis C of the wafer W to be rotated by the spin chuck 1. The middle structural member 20 integrally includes a second guide portion 48, and a hollow cylindrical process liquid separating wall 50 connected to the second guide portion 48.

The second guide member 48 disposes outside the first guide portion 25 of the inner structural member 19 and includes a lower edge portion 48a having a hollow cylindrical shape concentric with a lower portion of the first guide member 25, an upper edge portion 48b smoothly arcuately extending obliquely upward from an upper edge of the lower edge portion 48a toward the center thereof (toward the rotation axis C of the wafer W), and a folded portion 48c formed by folding a distal edge portion of the upper edge portion 48b downward.

The lower edge portion 48a is located above the inner recovery channel 27. The lower edge portion 48a is accommodated in the inner recovery channel 27 in spaced relation with respect to the bottom portion 49 of the inner recovery channel 27 and the middle wall 24 and the first guide portion 25 when the middle structural member 20 and the inner structural member 19 are located in the closest relation.

The upper edge portion 48b vertically overlaps with the upper edge portion 25b of the first guide portion 25 of the inner structural member 19. When the middle structural member 20 and the inner structural member 19 are located in the closest relation, the upper edge portion 48b is located close to the upper edge portion 25b of the first guide portion 25 with a very small gap being defined between the upper edge portion 48b and the upper edge portion 25b. A folded portion 48c is formed at a distal edge of the upper edge portion 48b by folding a distal edge portion of the upper edge portion 48c downward. The folded portion 48c horizontally overlaps with the upper edge portion 25b of the first guide portion 25 when the middle structural member 20 and the inner structural member 19 are located in the closest relation.

Further, the upper edge portion 48b of the second guide portion 48 has a thickness which is progressively increased toward a lower side, and the process liquid separating wall 50 is connected to an outer peripheral edge of the upper edge portion 48b to form a hollow cylindrical shape. The process liquid separating wall 50 is located above the outer recovery channel 52, and accommodated in the outer recovery channel 52 in spaced relation with respect to the bottom portion of the outer recovery channel 52, the middle wall 24, and the outer structural member 21 when the inner structural member 19 and the middle structural member 20 are located in the closest relation.

The outer structural member 21 is provided around the spin chuck 1 outside the second guide portion 48 of the middle structural member 20, has a generally rotationally symmetrical shape about the rotation axis C of the wafer W to be rotated by the spin chuck 1, and has a function to work as a third guide portion. The outer structural member 21 includes a lower edge portion 21a having a hollow cylindrical shape concentric with the lower edge portion 48a of the second guide member 48, an upper edge portion 21b smoothly arcuately extending obliquely upward from an upper edge of the lower edge portion 21a toward the center thereof (toward the rotation axis C of the wafer W), and a folded portion 21c formed by folding a distal edge portion of the upper edge portion 21b downward.

The lower edge portion 21a is located above the outer recovery channel 52, and has a length such as to be accommodated in the outer recovery channel 52 in spaced relation with respect to the process liquid separating wall 50 and the outer wall 51, and the bottom portion of the outer recovery channel 52 when the inner structural member 19 and the outer structural member 21 are located in the closest relation.

The upper edge portion 21b vertically overlaps with the upper edge portion 48b of the second guide portion 48 of the middle structural member 20. When the outer structural member 21 and the middle structural member 20 are located in the closest relation, the upper edge portion 21b is located close to the upper edge portion 48b of the second guide portion 48 with a very small gap being defined between the upper edge portion 21b and the upper edge portion 48b.

The folded portion 21c horizontally overlaps with the upper edge portion 48b of the second guide portion 48 when the outer structural member 21 and the middle structural member 20 are located in the closest relation.

A first lift mechanism 66 for moving up and down the inner structural member 19, a second lift mechanism 67 for moving up and down the middle structural member 20, and a third lift mechanism 68 for moving up and down the outer structural member 21 are provided.

The first lift mechanism 66 includes, for example, a ball screw mechanism fixed to the base 16 and a coupling member which couples a drive part of the ball screw mechanism to the bottom portion 22 of the inner structural member 19. The second lift mechanism 67 and the third lift mechanism 68 can be realized by a similar structure. In order to couple the second lift mechanism 67 and the middle structural member 20, for example, a coupling portion and a mounting block may be formed unitarily with the middle structural member 20. The coupling portion may extend from a proper place (one place or plurality of places equiangularly at an interval) on the lower end of the process liquid separating wall 50 through under the lower edge portion 21a of the outer structural member 21 to the outer side of the lower edge portion 21a thereof. The mounting block may be installed consecutively to the coupling portion. In this case, it is preferable to form a protruding portion on the outer wall 51 of the inner structural member 19 which protrudes outward so as to accommodate the mounting block therein.

The substrate processing apparatus further has a controlling section 80 including a microprocessor. The controlling section 80 controls the first lift mechanism 60, the second lift mechanism 67 and the third lift mechanism 68 so as to locate the inner structural member 19, the middle structural member 20 and the outer structural member 21 at proper positions in individual steps of the process of the wafer W.

Figure 2:
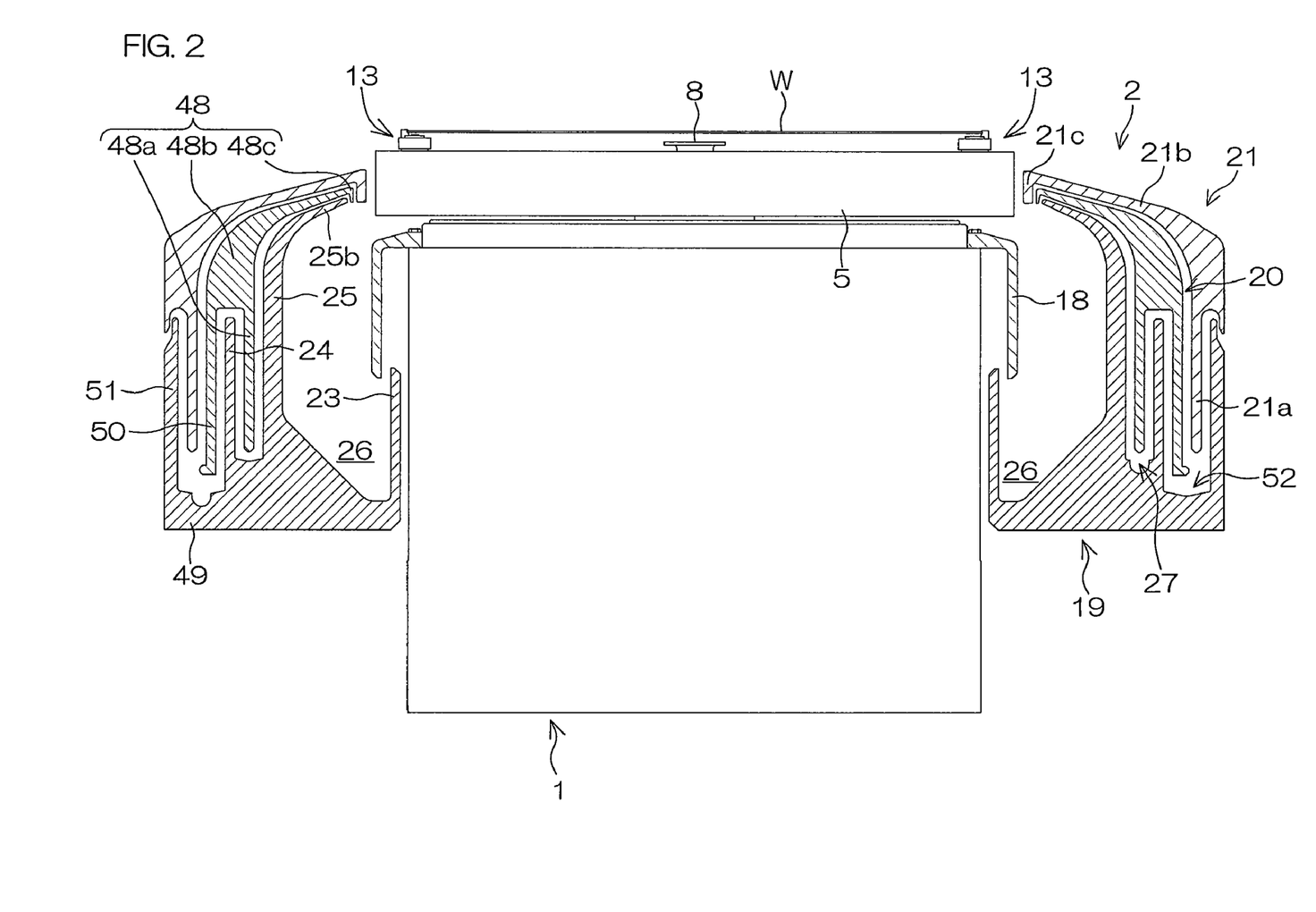
FIG. 2 is a schematic sectional view for explaining positions of an inner structural member, a middle structural member and an outer structural member during a wafer loading operation and a wafer drying operation.

FIGS. 2 to 5 are schematic sectional views for explaining the positions of the inner structural member 19, the middle structural member 20 and the outer structural member 21 in the individual steps of the process of the wafer W. Before the loading of the wafer W, the inner structural member 19, the middle structural member 20 and the outer structural member 21 are located at the lowermost position as shown in FIG. 2. At this time, the upper edge portion 25b of the first guide portion 25 of the inner structural member 19, the upper edge portion 48b of the second guide portion 48 of the middle structural member 20 and the upper edge portion 21b of the outer structural member 21 are located at a lower level than a wafer holding position at which the wafer W is held by the spin chuck 1.

Figure 3:
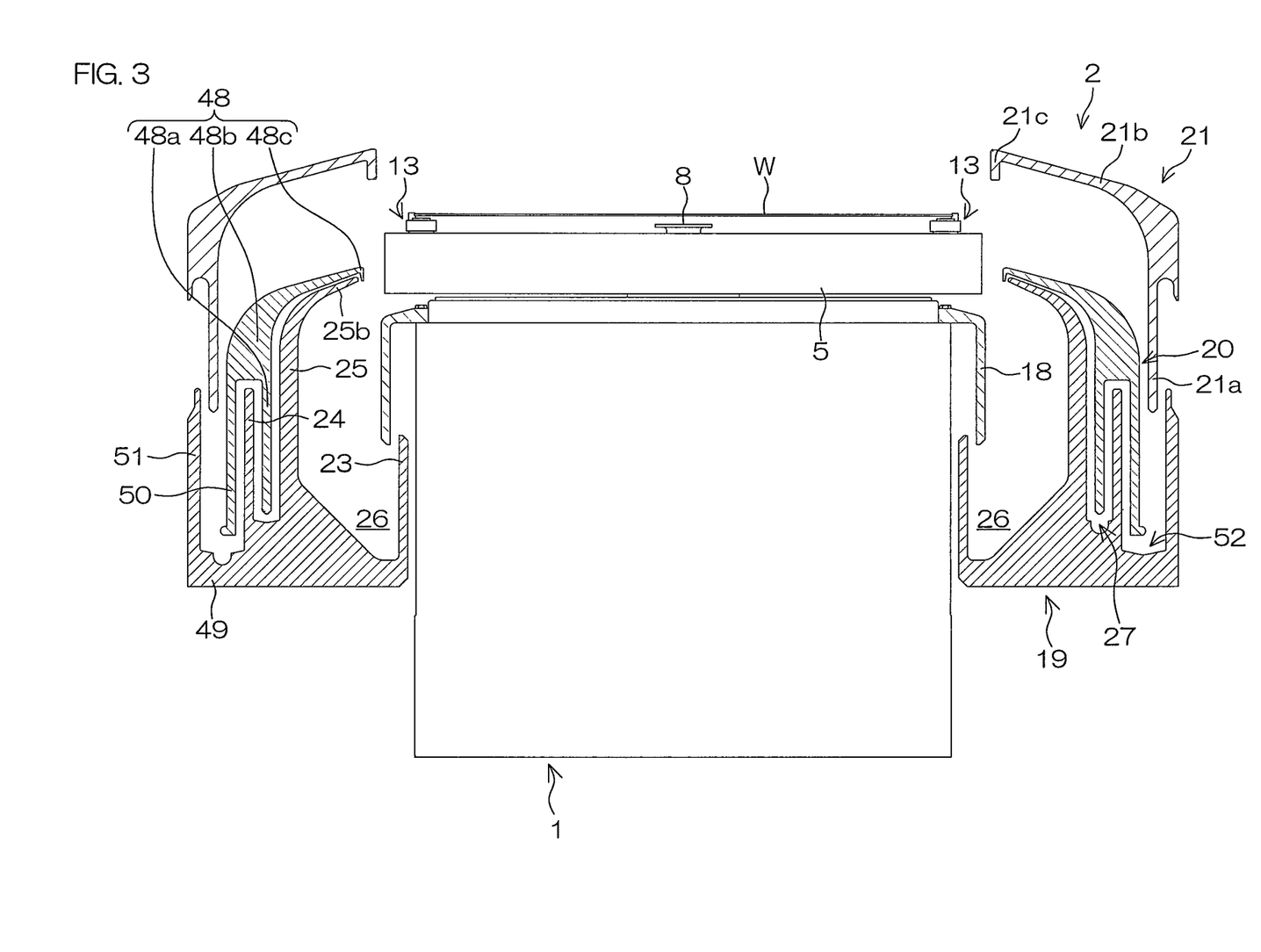
FIG. 3 is a schematic sectional view for explaining positions of the inner structural member, the middle structural member and the outer structural member during a wafer process with a first chemical.

When the wafer W is loaded to be held by the spin chuck 1, only the outer structural member 21 is moved up, whereby the upper edge portion 21b of the outer structural member 21 is located at a higher level than the wafer W held by the spin chuck 1 as shown in FIG. 3. Thus, an opening is defined between the upper edge portion 48b of the second guide member 48 of the middle structural member 20 and the upper edge portion 21b of the outer structural member 21 in opposed relation to the peripheral edge surface of the wafer W.

Thereafter, the wafer W (spin chuck 1) is rotated, and the first chemical is supplied to the front and rear surfaces of the rotating wafer W from the nozzle 3 and the rear surface nozzle 8, respectively. The first chemical supplied to the front and rear surfaces of the wafer W receives a centrifugal force generated by the rotation of the wafer W to flow over the front and rear surfaces of the wafer W, and is scattered radially outward from the peripheral edge of the wafer W. Thus, the first chemical is spread over the front and rear surfaces of the wafer W, whereby the process of the front and rear surfaces of the wafer W with the first chemical is achieved.

The first chemical spun out to be scattered radially outward from the peripheral edge of the wafer W enters the opening between the upper edge portion 48$b$ of the second guide portion 48 of the middle structural member 20 and the upper edge portion 21$b$ of the outer structural member 21. Then, the first chemical flows down along an inner surface of the outer structural member 21 to be collected in the outer recovery channel 52 and recovered from the outer recovery channel 52 into the second recovery tank through the second recovery mechanism 53. At this time, the inner structural member 19 and the middle structural member 20 are located in close relation with the very small gap being defined between the upper edge portion 25$b$ of the first guide portion 25 of the inner structural member 19 and the upper edge portion 48$b$ of the second guide portion 48 of the middle structural member 20, and the folded portion 48$c$ of the second guide portion 48 horizontally overlaps with the upper edge portion 25$b$ of the first guide portion 25, whereby the process liquid is prevented from intruding into a space between the first guide portion 25 and the second guide portion 48. Further, the process liquid separating wall 50 provided with the middle structural member 20 prevents the first chemical intruded into a space between the upper edge portion 48$b$ of the second guide portion 48 of the middle structural member 20 and upper edge portion 21$b$ of the outer structural member 21 from intruding into the inner recovery channel 27, whereby the first chemical is guided to the outer recovery channel 52.

After the first chemical is supplied to the wafer W for a predetermined period, the inner structural member 19 and the middle structural member 20 are moved up, so that the upper edge portion 25$b$ of the first guide portion 25 of the inner structural member 19, the upper edge portion 48$b$ of the second guide portion 48 of the middle structural member 20 and the upper edge portion 21$b$ of the outer structural member 21 are located at a higher level than the wafer W held by the spin chuck 1 as shown in FIG. 4. At this time, the inner structural member 19 and the middle structural member 20 are moved up in synchronization with the very small gap being defined between the upper edge portion 25$b$ of the first guide portion 25 of the inner structural member 19 and the upper edge portion 48$b$ of the second guide portion 48 of the middle structural member 20 (while being kept in a predetermined positional relation). Thus, the process liquid scattered from the wafer W is prevented from intruding into the space between the first guide portion 25 and the second guide portion 48 even when the rotation of the wafer W by the spin chuck 1 and the supply of the first chemical are continued.

Thereafter, the supply of the first chemical from the nozzle 3 and the rear surface nozzle 8 is stopped. Then, the pure water is supplied to the front and rear surfaces of the wafer W from the nozzle 3 and the rear surface nozzle 8, respectively. Thus, the rinsing operation is performed to rinse the front and rear surfaces of the wafer W with the pure water. The pure water supplied to the front and rear surfaces of the wafer W receives a centrifugal force generated by the rotation of the wafer W to flow over the front and rear surfaces of the wafer W. At this time, the first chemical adhering to the front and rear surfaces of the wafer W is rinsed away. Then, the pure water containing the first chemical is spun out from the peripheral edge of the wafer W to be scattered.

The pure water (containing the first chemical) spun out to be scattered radially outward from the peripheral edge of the wafer W is captured by an inner surface of the first guide portion 25 of the inner structural member 19. Then, the pure water flows down along the inner surface of the inner structural member 19 to be collected in the drain channel 26, and is discharged together with the atmosphere of the drain channel 26 by the evacuation mechanism 28. At this time, the inner structural member 19, the middle structural member 20 and the outer structural member 21 are located in close relation with the very small gaps being defined between the upper edge portions of the inner structural member 19 and the middle structural member 20 and between the upper edge portions of the middle structural member 20 and the outer structural member 21. Further, the folded portion 21$c$ of the outer structural member 21 horizontally overlaps with the upper edge portion 48$b$ of the second guide portion 48, and the folded portion 48$c$ of the second guide portion 48 horizontally overlaps with the upper edge portion 25$b$ of the first guide portion 25. Thus, the process liquid is prevented from intruding into the space between the first guide portion 25 and the second guide portion 48 and a space between the second guide portion 48 and the outer structural member 21.

Figure 5:
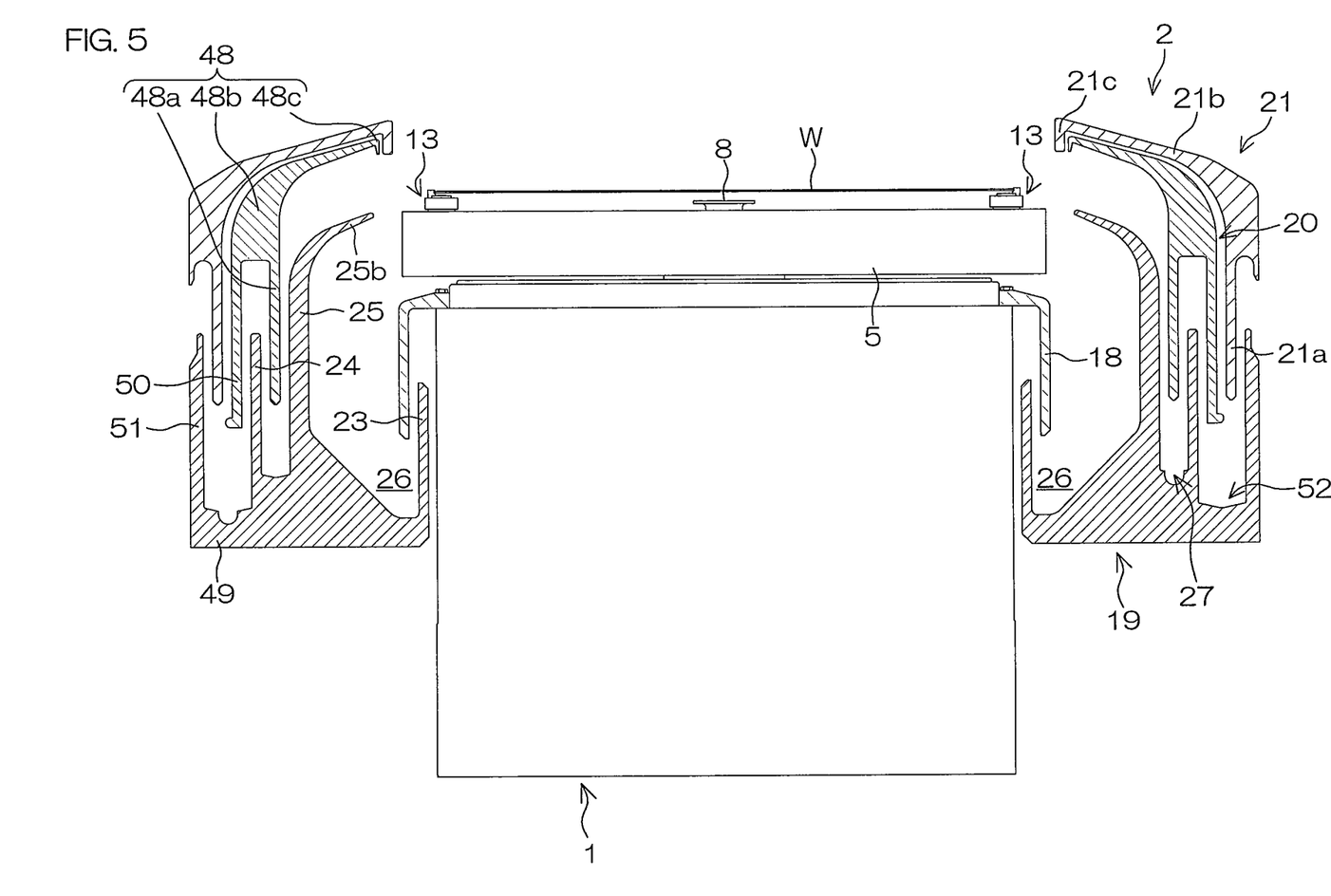
FIG. 5 is a schematic sectional view for explaining positions of the inner structural member, the middle structural member and the outer structural member during a wafer process with a second chemical.

After the pure water is supplied to the wafer W for a predetermined period, the supply of the pure water from the nozzle 3 and the rear surface nozzle 8 is stopped. Then, the inner structural member 19, the middle structural member 20 and the outer structural member 21 are moved down to the lowermost position, whereby the upper edge portion 25$b$ of the first guide portion 25 of the inner structural member 19, the upper edge portion 48$b$ of the second guide portion 48 of the middle structural member 20 and the upper edge portion 21$b$ of the outer structural member 21 are located at a lower level than the wafer W as shown in FIG. 2. Thereafter, the rotation speed of the wafer W (spin chuck 1) is increased to a predetermined high rotation speed to perform a drying operation for a predetermined period to dry the wafer W by spinning out the rinse liquid adhering to the surfaces of the rinsed wafer W by a centrifugal force. After the completion of the drying operation, the rotation of the wafer W by the spin chuck 1 is stopped, and the processed wafer W is unloaded from the spin chuck 1.

Where the wafer W is to be processed with the second chemical immediately after the rinsing operation following the process with the first chemical, the supply of the pure water from the nozzle 3 and the rear surface nozzle 8 is stopped. Thereafter, the inner structural member 19 is moved down from the state in which the inner structural member 19, the middle structural member 20 and the outer structural member 21 are located at the uppermost position, so that only the upper edge portion 25$b$ of the first guide portion 25 of the inner structural member 19 is located at a lower level than the wafer W held by the spin chuck 1 as shown in FIG. 5. Thus, an opening is defined between the upper edge portion of the inner structural member 19 and the upper edge portion 48$b$ of the second guide portion 48 of the middle structural member 20 in opposed relation to the peripheral edge surface of the wafer W.

Then, the second chemical is supplied to the front and rear surfaces of the wafer W rotated continuously from the rinsing operation from the nozzle 3 and the rear surface nozzle 8, respectively. The second chemical supplied to the front and rear surfaces of the wafer W receives a centrifugal force generated by the rotation of the wafer W to flow over the front and rear surfaces of the wafer W, and is scattered radially outward from the peripheral edge of the wafer W. Thus, the second chemical is spread over the front and rear surfaces of the wafer W, whereby the process of the front and rear surfaces of the wafer W with the second chemical is achieved.

The second chemical spun out to be scattered radially outward from the peripheral edge of the wafer W enters the opening between the upper edge portion 25b of the first guide portion 25 of the inner structural member 19 and the upper edge portion 48b of the second guide portion 48 of the middle structural member 20. Then, the second chemical flows down along an inner surface of the second guide portion 48 to be collected in the inner recovery channel 27 and recovered from the inner recovery channel 27 into the first recovery tank through the first recovery mechanism 35. At this time, the middle structural member 20 and the outer structural member 21 are located in close relation with the very small gap being defined between the upper edge portion 48b of the second guide portion 48 of the middle structural member 20 and the upper edge portion 21b of the outer structural member 21, and the folded portion 21c of the outer structural member 21 horizontally overlaps with the upper edge portion 48b of the second guide portion 48, whereby the process liquid is prevented from intruding into the space between the second guide portion 48 and the outer structural member 21.

After the second chemical is supplied to the wafer W for a predetermined period, the inner structural member 19 is moved up, so that the upper edge portion 25b of the first guide portion 25 of the inner structural member 19, the upper edge portion 48b of the second guide portion 48 of the middle structural member 20 and the upper edge portion 21b of the outer structural member 21 are located at a higher level than the wafer W held by the spin chuck 1 as shown in FIG. 4.

Thereafter, the supply of the second chemical from the nozzle 3 and the rear surface nozzle 8 is stopped. Then, the pure water is supplied to the front and rear surfaces of the wafer W from the nozzle 3 and the rear surface nozzle 8, respectively, whereby the rinsing operation is performed to wash away the second chemical adhering to the front and rear surfaces of the wafer W. In this rinsing operation, the pure water (containing the second chemical) spun out to be scattered radially outward from the peripheral edge of the wafer W is collected in the drain channel 26 and discharged as in the rinsing operation performed after the process with the first chemical. Further, the inner structural member 19, the middle structural member 20 and the outer structural member 21 are located in close relation with the very small gaps being defined between the upper edge portions of the inner structural member 19 and the middle structural member 20 and between the upper edge portions of the middle structural member 20 and the outer structural member 21. Further, the folded portion 21c of the outer structural member 21 horizontally overlaps with the upper edge portion 48b of the second guide portion 48, and the folded portion 48c of the second guide portion 48 horizontally overlaps with the upper edge portion 25b of the first guide portion 25. Thus, the process liquid is prevented from intruding into the space between the first guide portion 25 and the second guide portion 48 and the space between the second guide portion 48 and the outer structural member 21.

After the pure water is supplied to the wafer W for a predetermined period, the supply of the pure water from the nozzle 3 and the rear surface nozzle 8 is stopped. Then, the inner structural member 19, the middle structural member 20 and the outer structural member 21 are moved down to the lowermost position, whereby the upper edge portion 25b of the first guide member 25 of the inner structural member 19, the upper edge portion 48b of the second guide portion 48 of the middle structural member 20 and the upper edge portion 21b of the outer structural member 21 are located at a lower level than the wafer W as shown in FIG. 2. Thereafter, the rotation speed of the wafer W (spin chuck 1) is increased to the predetermined high rotation speed to perform the drying operation for a predetermined period to dry the wafer W by spinning out the rinse liquid adhering to the surfaces of the rinsed wafer W by a centrifugal force. After the completion of the drying operation, the rotation of the wafer W by the spin chuck 1 is stopped, and the processed wafer W is unloaded from the spin chuck 1.

In the substrate processing apparatus, as describe above, the inner structural member 19, the middle structural member 20 and the outer structural member 21 can be moved up and down independently of each other. This makes it possible to locate the upper edge portions of the inner structural member 19, the middle structural member 20 and the outer structural member 21 at a higher level than the wafer W held by the spin chuck 1, to locate only the upper edge portion 21b of the outer structure member 21 at a higher level than the wafer W held by the spin chuck 1, to locate only the upper edge portion 25b of the first guide portion 25 of the inner structural member 19 at a lower level than the wafer W held by the spin chuck 1, and to locate the upper edge portions of the inner structural member 19, the middle structural member 20 and the outer structural member 21 at a lower level than the wafer W held by the spin chuck 1 by moving up and down the structural members 19, 20, 21.

During the supply of the first chemical to the wafer W, only the upper edge portion 21b of the outer structural member 21 is located at a higher level than the wafer W held by the spin chuck 1. Thus, the opening is defined between the upper edge portion 48b of the second guide portion 48 of the middle structural member 20 and the upper edge portion 21b of the outer structural member 21 in opposed relation to the peripheral edge surface of the wafer W, so that the first chemical spun out to be scattered radially outward from the peripheral edge of the wafer W can be introduced into the space between the middle structural member 20 and the outer structural member 21. Then, the introduced first chemical is guided by the outer structural member 21 to be collected in the outer recovery channel 52 and recovered from the outer recovery channel 52 into the second recovery tank through the second recovery mechanism 53.

During the supply of the second chemical to the wafer W, only the upper edge portion 25b of the first guide portion 25 of the inner structural member 19 is located at a lower level than the wafer W held by the spin chuck 1. Thus, the opening is defined between the upper edge portion of the inner structural member 19 and the upper edge portion 48b of the second guide portion 48 of the middle structural member 20 in opposed relation to the peripheral edge surface of the wafer W, so that the second chemical spun out to be scattered radially outward from the peripheral edge of the wafer W can be introduced into the space between the inner structural member 19 and the middle structural member 20. Then, the introduced second chemical is guided by the middle structural member 20 to be collected in the inner recovery channel 27 and recovered from the inner recovery channel 27 into the first recovery tank through the first recovery mechanisms 35.

In addition, the inner recovery channel 27 in which the second chemical is recovered is isolated from the outer recovery channel 52 as shown in FIG. 10 during the supply of the second chemical to the wafer W (during the recovery of the second chemical), which eliminates the possibility that the first chemical flows into the inner recovery channel 27 from the outer recovery channel 52 due to the capillary phenomenon. Therefore, a process liquid different from the second chemical is prevented from flowing into the inner recovery channel 27. As a result, the purity of the second chemical recovered in the inner recovery channel 27 can be improved.

During the supply of the pure water to the wafer W, the upper edge portions of the inner structural member 19, the middle structural member 20 and the outer structural member 21 are located at a higher level than the wafer W held by the spin chuck 1. Thus, the pure water scattered radially outward from the wafer W is captured by the inner surface of the first guide portion 25 of the inner structural member 19, and guided by the first guide portion 25 to be collected in the drain channel 26. At this time, the inner structural member 19, the middle structural member 20 and the outer structural member 21 are located in close relation with the very small gaps being defined between the upper edge portions of the inner structural member 19 and the middle structural member 20 and between the upper edge portions of the middle structural member 20 and the outer structural member 21, whereby the process liquid is prevented from intruding into the space between the first guide portion 25 and the second guide portion 48 and the space between the second guide portion 48 and the outer structural member 21. Further, the inner structural member 19, the middle structural member 20 and the outer structural member 21 do not contact with each other, which eliminates the possibility that particles are generated due to the contact of these members 19, 20, 21 (by abrasion of the members 19, 20, 21 due to the contact).

During the supply of the second chemical and the pure water to the wafer W, there is no particular need to move up the outer structural member 21, but the outer structural member 21 can be located at the same position as assumed for guiding and recovering the first chemical. Therefore, there is no need to provide a greater space above the spin chuck 1, the height of the apparatus is correspondingly reduced.

While one embodiment of the present invention has been described above, the present invention may be practiced in other embodiments. In the embodiment described above, the first chemical, the second chemical and the pure water are used for the process by way of example, but a third chemical different from the first and second chemicals may be additionally used for the process of the wafer W, and the third chemical used for the process may be recovered. In this case, an additional structural member having the same construction as the outer structural member 21 for guiding the third chemical is provided outside the outer structural member 21, and a recovery channel for recovering the third chemical guided by the additional structural member is provided unitarily with the inner structural member 19. Thus, the existing middle and outer structural members 20, 21 are utilized together with the additional structural member for the process. Therefore, a significant cost increase can be avoided. Similarly, where four or more chemicals are used for the process of the wafer W and recovered, a significant cost increase can be avoided by the aforesaid arrangement. That is, the apparatus can be modified so as to recover increased types of chemicals without a significant cost increase. Further, when the process liquid is guided by the inner structural member 19 or the middle structural member 20, there is no particular need to move up the additional outermost structural member, thereby preventing the increase in the height of the apparatus.

In the embodiments described above, the apparatus is adapted to perform the cleaning process on the wafer W by way of example, but the process to be performed by the inventive apparatus is not limited to the cleaning process. For example, the invention is applicable to an etching process apparatus for removing an unnecessary thin film from a surface of a wafer W with the use of an etching liquid, a polymer removing apparatus for removing an unnecessary polymer residue from a surface of a wafer W with the use of a polymer removing chemical, a resist applying apparatus for applying a resist liquid on a surface of a wafer W for forming a resist film, and a developing apparatus for supplying a developing chemical to a surface of a wafer W for developing a resist film.

While the embodiments of the present invention have thus been described in detail, it should be understood that these embodiments are merely illustrative of the technical principles of the present invention but not limitative of the invention. The spirit and scope of the present invention are to be limited only by the appended claims.

This application corresponds to Japanese Patent Application No. 2006-272147 filed with the Japanese Patent Office on Oct. 3, 2006, the disclosure of which is incorporated herein by reference.

What is claimed is:
1. A substrate processing apparatus, comprising:
a substrate holding unit which generally horizontally holds a substrate and rotates the substrate about a generally vertical rotation axis;
a process liquid supplying unit for supplying a process liquid to the substrate held by the substrate holding unit;
a first guide portion provided surrounding the substrate holding unit, having an upper edge portion extending toward the rotation axis, for receiving and guiding the process liquid scattered from the substrate rotated by the substrate holding unit to cause the process liquid to flow down;
a second guide portion provided surrounding the substrate holding unit outside the first guide portion, having an upper edge portion extending toward the rotation axis and vertically overlapping with the upper edge portion of the first guide portion, for receiving and guiding the process liquid scattered from the substrate rotated by the substrate holding unit to cause the process liquid to flow down;
a third guide portion provided surrounding the substrate holding unit outside the second guide portion, having an upper edge portion extending toward the rotation axis and vertically overlapping with the upper edge portion of the second guide portion, for receiving and guiding the process liquid scattered from the substrate rotated by the substrate holding unit to cause the process liquid to flow down;
a first recovery channel, provided outside the first guide portion and formed integrally as a unit with the first guide portion, for recovering the process liquid guided to flow down by the second guide portion;
a second recovery channel, provided outside the first recovery channel and formed integrally as a unit with the first guide portion, for recovering the process liquid guided to flow down by the third guide portion;
a driving mechanism for moving up and down the first guide portion, the second guide portion, and third guide portion independently of each other, for selectively disposing said first, second and third guide portions in respective vertical positions so that only one of said first, second and third guide portions receives said scattered process liquid and guides said process liquid to flow down;
a hollow cylindrical inner wall provided inside the first guide portion and formed integrally as a unit with the first guide portion and thereby moving up and down with said first guide portion, and surrounding the rotation axis; and a hollow cylindrical cover flange, having a diameter larger than a diameter of the inner wall, fixed under the substrate holding unit and surrounding the rotation axis, wherein the inner wall and the hollow cylindrical cover flange are arranged such that the inner wall and the hollow cylindrical cover flange have respective portions that overlap with each other when seen horizontally, irrespective of a vertical position of the first guide portion, thereby blocking process liquid guided by said first guide portion from reaching the rotation axis.

2. A substrate processing apparatus as set forth in claim 1, further comprising a process liquid separating wall, formed integrally as a unit with the second guide portion, for preventing the process liquid guided into a space between the upper edge portion of the second guide portion and the upper edge portion of the third guide portion from intruding into the first recovery channel, thereby guiding the process liquid to the second recovery channel.

3. A substrate processing apparatus as set forth in claim 1, further comprising a first intrusion preventing portion arranged depending from said upper edge portion of said second guide portion and disposed inwardly from said upper edge portion of said first guide portion, so as to prevent the process liquid scattered from the substrate rotated by the substrate holding unit from intruding into a space between the first guide portion and the second guide portion when the process liquid is guided by said first guide portion, the first and second guide portions being held out of in contact with each other when the process liquid is guided by the first guide portion; and a second intrusion preventing portion arranged depending from said upper edge portion of said third guide portion and disposed inwardly from said first intrusion preventing portion and from said upper edge portion of said first guide portion, so as to prevent the process liquid scattered from the substrate rotated by the substrate holding unit from intruding into a space between the second guide portion and the third guide portion when the process liquid is guided by said first guide portion, the second and third guide portions being held out of in contact with each other when the process liquid is guided by the first guide portion, wherein the first intrusion preventing portion is a part of the upper edge portion of the second guide portion folded downward, and the second intrusion preventing portion is a part of the upper edge portion of the third guide portion folded downward.

4. A substrate processing apparatus as set forth in claim 1, further comprising a first intrusion preventing portion arranged depending from said upper edge portion of said second guide portion and disposed inwardly from said upper edge portion of said first guide portion, so as to prevent the process liquid scattered from the substrate rotated by the substrate holding unit from intruding into a space between the first guide portion and the second guide portion when the process liquid is guided by said first guide portion, the first and second guide portions being held out of in contact with each other when the process liquid is guided by the first guide portion; and a second intrusion preventing portion arranged depending from said upper edge portion of said third guide portion and disposed inwardly from said first intrusion preventing portion and from said upper edge portion of said first guide portion, so as to prevent the process liquid scattered from the substrate rotated by the substrate holding unit from intruding into a space between the second guide portion and the third guide portion when the process liquid is guided by said first guide portion, the second and third guide portions being held out of in contact with each other when the process liquid is guided by the first guide portion, wherein the first intrusion preventing portion is a part of the upper edge portion of the second guide portion vertically folded downward such that the first intrusion preventing portion completely blocks a space between the first guide portion and the second guide portion when the first and second guide portions are positioned close to each other, when viewed from a side of the substrate holding unit; and the second intrusion preventing portion is a part of the upper edge portion of the third guide portion vertically folded downward such that the second intrusion preventing portion completely blocks a space between the second guide portion and the third guide portion when the second and third guide portions are positioned close to each other, when viewed from a side of the substrate holding unit.

\* \* \* \* \*